(12) United States Patent
Lyu et al.

(10) Patent No.: US 7,405,450 B2
(45) Date of Patent: Jul. 29, 2008

(54) SEMICONDUCTOR DEVICES HAVING HIGH CONDUCTIVITY GATE ELECTRODES WITH CONDUCTIVE LINE PATTERNS THEREON

(75) Inventors: Gyu-Ho Lyu, Gyeonggi-do (KR); Soon-moon Jung, Gyeonggi-do (KR); Sung-bong Kim, Gyeonggi-do (KR); Hoon Lim, Seoul (KR); Won-Seok Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 461 days.

(21) Appl. No.: 10/777,297

(22) Filed: Feb. 12, 2004

(65) Prior Publication Data

US 2004/0173825 A1    Sep. 9, 2004

(30) Foreign Application Priority Data

Mar. 7, 2003    (KR) .................. 10-2003-0014387

(51) Int. Cl.
H01L 29/76    (2006.01)
H01L 29/94    (2006.01)
H01L 31/062    (2006.01)
H01L 31/113    (2006.01)
H01L 31/119    (2006.01)

(52) U.S. Cl. .................. 257/388; 257/207; 257/208; 257/211; 257/327; 257/336; 257/344; 257/377; 257/408; 257/413; 257/900

(58) Field of Classification Search ......... 257/207–208, 257/211, 388, 412–413, 327, 336, 344, 377, 257/408, 900
See application file for complete search history.

(56) References Cited

U.S. PATENT DOCUMENTS

| | | | | |
|---|---|---|---|---|
| 4,931,845 A * | 6/1990 | Ema | ......................... | 257/751 |
| 5,258,645 A * | 11/1993 | Sato | ......................... | 257/637 |
| 5,621,232 A * | 4/1997 | Ohno | ......................... | 257/288 |
| 5,631,484 A * | 5/1997 | Tsoi et al. | ................... | 257/341 |
| 5,637,903 A * | 6/1997 | Liao et al. | ................... | 257/412 |
| 5,652,154 A * | 7/1997 | Komuro | ................... | 438/234 |
| 5,754,467 A * | 5/1998 | Ikeda et al. | ................ | 365/154 |
| 5,929,958 A * | 7/1999 | Ohta et al. | ................... | 349/141 |
| 6,060,765 A * | 5/2000 | Maeda | ....................... | 257/635 |
| 6,093,628 A * | 7/2000 | Lim et al. | ................... | 438/592 |
| 6,107,108 A * | 8/2000 | Chen et al. | .................. | 438/14 |
| 6,157,065 A * | 12/2000 | Huang et al. | ............... | 257/355 |
| 6,300,201 B1* | 10/2001 | Shao et al. | .................. | 438/281 |
| 6,359,318 B1* | 3/2002 | Yamamoto et al. | ......... | 257/378 |
| 6,368,950 B1* | 4/2002 | Xiang et al. | ................ | 438/592 |
| 6,388,294 B1* | 5/2002 | Radens et al. | .............. | 257/368 |
| 6,465,309 B1* | 10/2002 | Xiang et al. | ................ | 438/299 |
| 6,518,113 B1* | 2/2003 | Buynoski | .................... | 438/217 |
| 6,528,826 B2* | 3/2003 | Yoshida et al. | ............. | 257/147 |
| 6,613,623 B1* | 9/2003 | Tsai et al. | .................. | 438/197 |
| 6,703,661 B2* | 3/2004 | Wu | ............................ | 257/315 |

(Continued)

*Primary Examiner*—Ida M Soward
(74) *Attorney, Agent, or Firm*—Myers Bigel Sibley & Sajovec

(57) ABSTRACT

Semiconductor devices that include a semiconductor substrate and a gate line are provided. The gate line is on the semiconductor substrate and includes a gate insulation pattern and a gate electrode which are stacked on the substrate in the order named. A spacer is on a sidewall of the gate line. A conductive line pattern is on the gate line. The conductive line pattern is parallel with the gate line and is electrically connected to the gate electrode.

28 Claims, 17 Drawing Sheets

U.S. PATENT DOCUMENTS

| | | | |
|---|---|---|---|
| 6,797,551 B2 * | 9/2004 | Oguchi | 438/196 |
| 2001/0055867 A1 * | 12/2001 | Lee | 438/586 |
| 2002/0119640 A1 * | 8/2002 | Gonzalez | 438/455 |
| 2004/0119113 A1 * | 6/2004 | Simacek et al. | 257/318 |

* cited by examiner

SEMICONDUCTOR DEVICES HAVING HIGH CONDUCTIVITY GATE ELECTRODES WITH CONDUCTIVE LINE PATTERNS THEREON

CROSS REFERENCE TO RELATED APPLICATIONS

This application claims priority under 35 U.S.C. § 119 to Korean Patent Application No. 2003-14387, filed Mar. 7, 2003, the contents of which are incorporated herein in its entirety by reference.

FIELD OF THE INVENTION

The present invention relates to semiconductor devices and methods of forming the same. More specifically, the present invention is directed to a semiconductor device having gate electrodes and methods of forming the same.

BACKGROUND OF THE INVENTION

Metal-oxide semiconductor (MOS) transistors include a gate electrode formed on a semiconductor substrate and a source/drain region formed in the semiconductor substrate adjacent to opposite sides of the gate electrode. The linewidth of the gate electrode may be an important dimension in the design of the device. As the size of MOS transistors has decreased, a corresponding reduction in the linewidth of the gate electrode has also occurred. As the linewidth of the gate electrode is reduced, the resistance of the gate electrode typically increases. This increased may resistance reduce the operation speed of the MOS transistor, making it difficult to achieve high speed devices.

A method of forming a gate electrode made of polycide has been proposed as a way to reduce the resistance of the gate electrode. The polycide layer has a structure in which a low-resistance metal silicide layer is stacked on a doped polysilicon layer. A MOS transistor having a conventional polycide gate electrode is illustrated in FIG. 1, and a cross-sectional view of the device taken along the line I-I' of FIG. 1 is shown in FIG. 2.

As shown in FIGS. 1 and 2, a device isolation layer 2 is provided on predetermined regions of a semiconductor substrate 1 to define a plurality of active regions 3. A gate line 7 crosses over the active regions 3. The gate line 7 includes a gate insulating layer 4, a doped polysilicon layer 5, and a metal silicide layer 6 which are stacked on the semiconductor substrate 1 in the order named. The metal silicide layer 6 may be made of cobalt silicide. The doped polysilicon layer 5 and the metal silicide layer 6 together form the gate electrode of the MOS transistor. An impurity diffusion layer 8 is provided on the active regions 3 adjacent opposite sides of the gate line 7. The impurity diffusion layer 8 corresponds to the source/drain regions of the MOS transistor.

Since the metal silicide layer 6 has a lower resistance than the doped polysilicon layer 5, the metal silicide layer 6 acts to reduce the resistance of the gate electrode. As semiconductor devices have become more highly integrated, the linewidth of the gate line 7 has been reduced. As the linewidths are reduced, defects may appear in the metal silicide layer 6 that can result in a crack in the metal silicide layer 6 (the crack is denoted as "A" in FIGS. 1 and 2). The crack A can negatively impact operation of the device, particularly in the case where the linewidth of the gate line 7 is similar to the grain size of the metal silicide layer 6. Because of the crack A in the metal silicide layer 6, the resistance of the gate electrode may be significantly increased. As a result, the operation speed of the MOS transistor may be reduced.

SUMMARY OF THE INVENTION

Embodiments of the present invention provide semiconductor devices and methods of fabricating semiconductor devices that include a plurality of isolation regions in a semiconductor substrate that define an active region. A gate electrode that includes a metal silicide layer on a polysilicon layer is provided on the active region, and a conductive layer is electrically connected to the gate electrode. The conductive layer bridges at least one gap in the metal silicide layer. The conductive layer may be a conductive line pattern that is formed of aluminum, tungsten, titanium, tantalum, and/or copper. The conductive layer may decrease the resistance of the gate electrode. A gate insulation pattern may be provided between the active region and the gate electrode.

The semiconductor devices may further include an interlayer dielectric on the semiconductor substrate. The interlayer dielectric may have a groove in which the conductive line pattern is formed. The interlayer dielectric may include one or more additional grooves in which plug lines are formed to electrically connect a source/drain region in the semiconductor device with a source/drain region of an adjacent semiconductor device.

In further embodiments of the present invention, the semiconductor device may include a planarized interlayer dielectric on the semiconductor substrate. The top surface of this planarized interlayer dielectric and the top surface of the gate electrode may be at substantially the same height above the semiconductor substrate. The semiconductor device may also include a second active region in the semiconductor substrate with a second gate electrode thereon that includes a polysilicon layer. The conductive layer in these devices may by a conductive line pattern that electrically connects the gate electrode and the second gate electrode.

According to further embodiments of the present invention, semiconductor devices are provided that include a semiconductor substrate and a gate line. The gate line includes a gate insulation pattern and a gate electrode which are sequentially stacked on the semiconductor substrate. A spacer is formed on a sidewall of the gate line, and a conductive line pattern is on the gate line. The conductive line pattern is parallel to the gate line and electrically connected to the gate electrode.

In these semiconductor devices, the gate electrode may include a doped polysilicon layer, and may optionally also include a metal silicide layer on the doped polysilicon layer. The semiconductor device may further include an interlayer dielectric on the semiconductor substrate, the gate line, and the spacer that includes a groove that exposes a top surface of the gate line. The conductive line pattern may be disposed in this groove. Alternatively, the semiconductor device may include an interlayer dielectric which is formed on the semiconductor substrate, gate line and spacer that is planarized down to the top surface of the gate line. The length of the conductive line pattern may be at least as long as the length of the gate line. The conductive line pattern may be made of metal.

According to still further embodiments of the present invention, semiconductor devices are provided that include first and second gate lines on a semiconductor substrate. The first gate line includes a first gate insulation pattern and a first gate electrode which are stacked in the order named, and the second gate line includes a second gate insulation pattern and a second gate electrode which are stacked in the order named.

A conductive line pattern may be provided on the first and second gate lines, and may have a first portion that is parallel to the first gate line and a second portion that is parallel to the second gate line. The conductive line pattern may electrically connect the first and second gate electrodes with each other.

In these semiconductor devices, the first and second gate lines include a doped polysilicon layer, and may also include a metal silicide layer on the doped polysilicon layer. The device may also include a spacer on the sidewalls of the first and second gate lines. The first portion of the conductive line pattern may have at least the same length as the first gate line, and the second portion of the conductive line pattern may have at least the same length as the second gate line.

According to further embodiments of the present invention, a semiconductor device may be fabricated by forming a gate line that includes a gate insulation pattern and a gate electrode on a semiconductor substrate. A spacer is formed on a sidewall of the gate line, and an interlayer dielectric is formed on the semiconductor substrate, the spacer and the gate line. A top surface of the gate line is exposed, and a conductive line pattern is formed on the exposed gate line to be parallel with the gate line.

The gate electrode may include at least a doped polysilicon layer. The gate electrode may further include a metal silicide layer on the doped polysilicon layer.

The top surface of the gate line may be exposed by patterning the interlayer dielectric to form a groove that exposes the top surface of the gate line. The conductive line pattern may be formed by forming a conductive layer on the surface of the semiconductor substrate to fill the groove and planarizing the conductive layer down to a top surface of the interlayer dielectric to form the conductive line pattern in the groove. Alternatively, the top surface of the gate line may be exposed by planarizing the interlayer dielectric until the top surface of the gate line is exposed. The conductive line pattern in such embodiments may then be formed by forming a conductive layer on the surface of a semiconductor substrate and the exposed the gate line and patterning the conductive layer to form the conductive line pattern on the gate line.

Pursuant to still further embodiments of the present invention, semiconductor devices are fabricated by forming a first gate line and a second gate line that is spaced apart from the first gate line on a semiconductor substrate. The first gate line includes a first gate line insulation pattern and a first gate electrode which are stacked in the order named, and the second gate line includes a second gate line insulation pattern and a second gate electrode which are stacked in the order named. A spacer is formed on a sidewall of the first and second gate lines. An interlayer dielectric is formed on the surface of the semiconductor substrate including the spacer. Top surfaces of the first and second gate lines are exposed. A conductive line pattern is formed on the exposed first and second gate lines. The conductive line pattern has a portion parallel with the first gate line and a portion parallel with the second gate line and electrically connects the first and second gate electrodes with each other.

DETAILED DESCRIPTION

Figure 1:
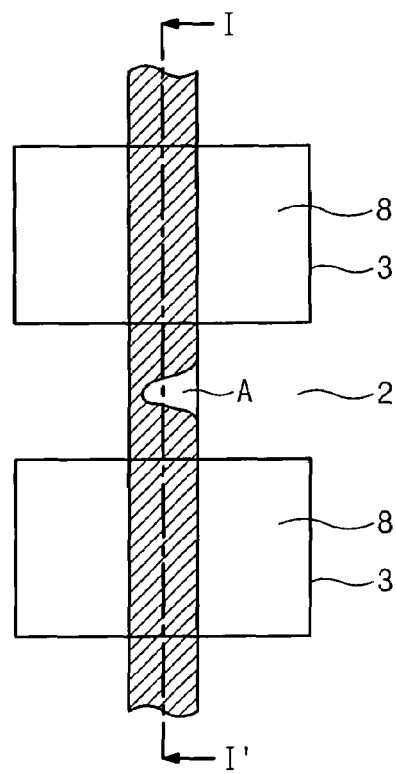
FIG. 1 is a top plan view of a conventional MOS transistor having a polycide gate electrode.
Figure 2:
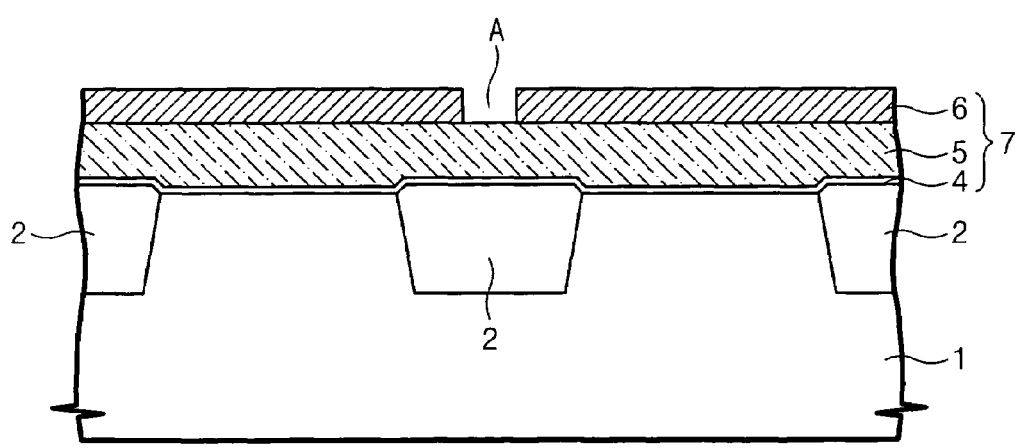
FIG. 2 is a cross-sectional view taken along a line I-I' of FIG. 2.

The present invention will now be described more fully with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. It will also be understood that when a layer or element is referred to as being "on" another layer, element or substrate, it can be directly on the other layer, element or substrate, or intervening layers and/or elements may also be present. In contrast, when a layer/element is referred to as being "directly on" another layer/element, there are no intervening layers or elements present. Likewise, when an element is described as being "between" two other elements it may be the only element between the two other elements or additional elements may also be present. Like reference numerals refer to like elements throughout.

An examplary semiconductor device according to certain embodiments of the present invention will now be described with reference to FIGS. 3, 4 and 5. FIG. 4 is a cross-sectional view taken along the line II-II' of FIG. 3, and FIG. 5 is a cross-sectional view taken along the line III-III' of FIG. 3.

Figure 3:
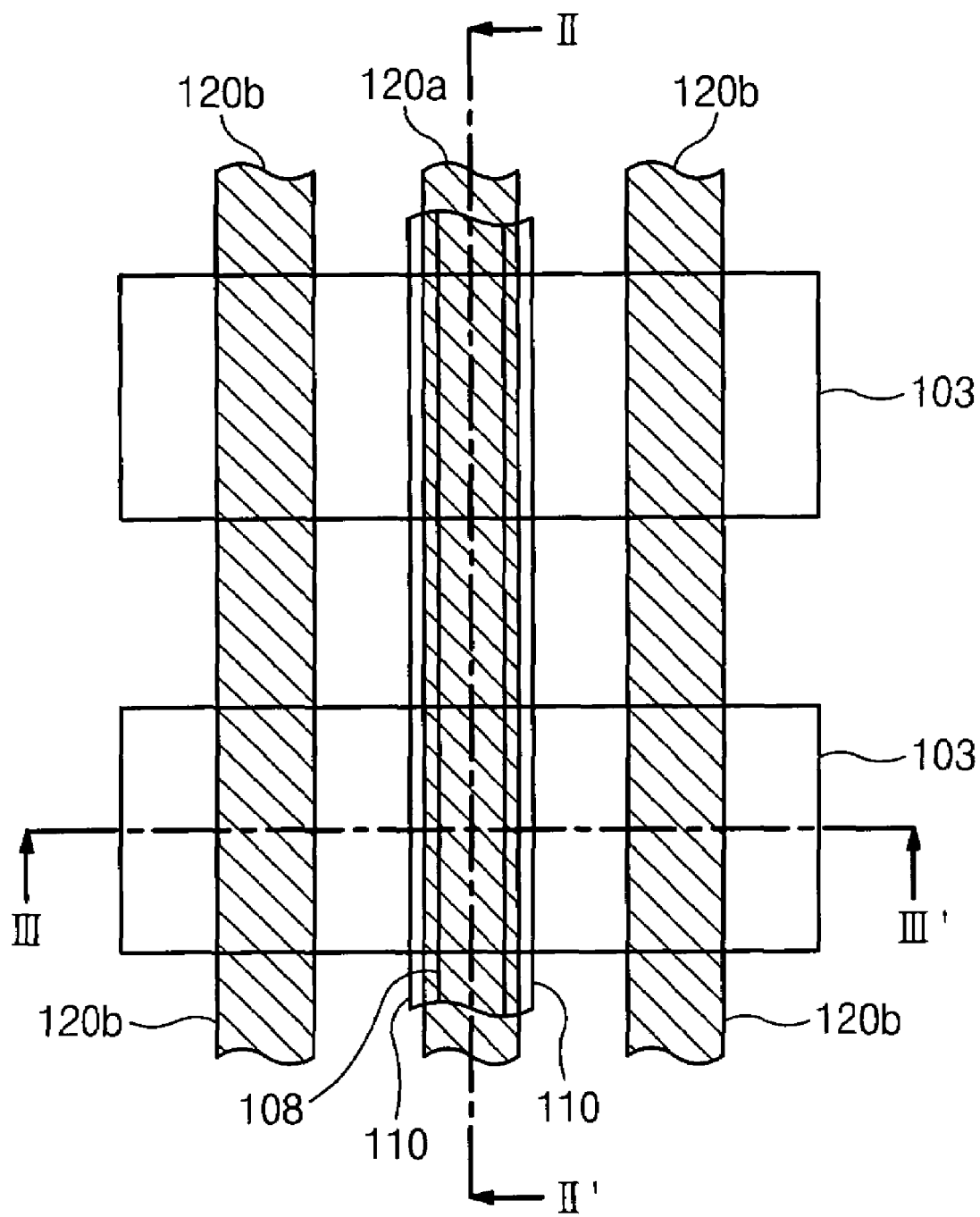
FIG. 3 is a top plan view of a semiconductor device having a gate electrode according to embodiments of the present invention.
Figure 4:
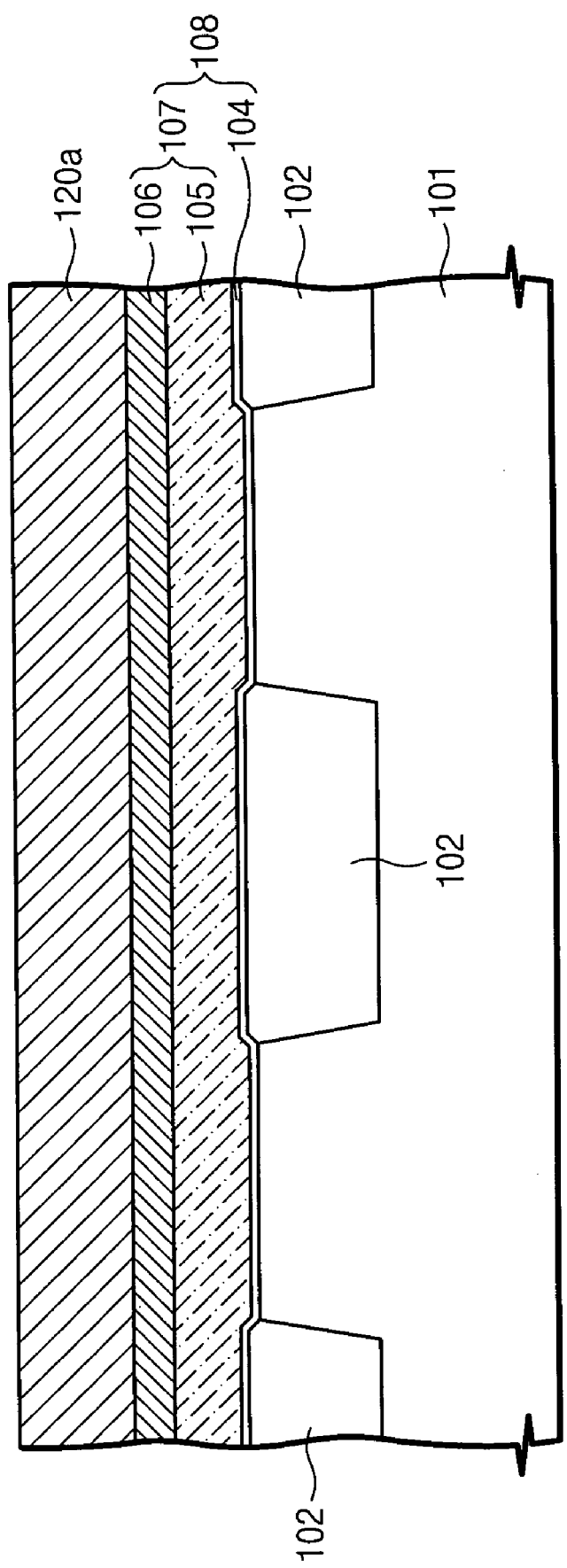
FIG. 4 is a cross-sectional view of the device of FIG. 3 taken along the line II-II' of FIG. 3.
Figure 5:
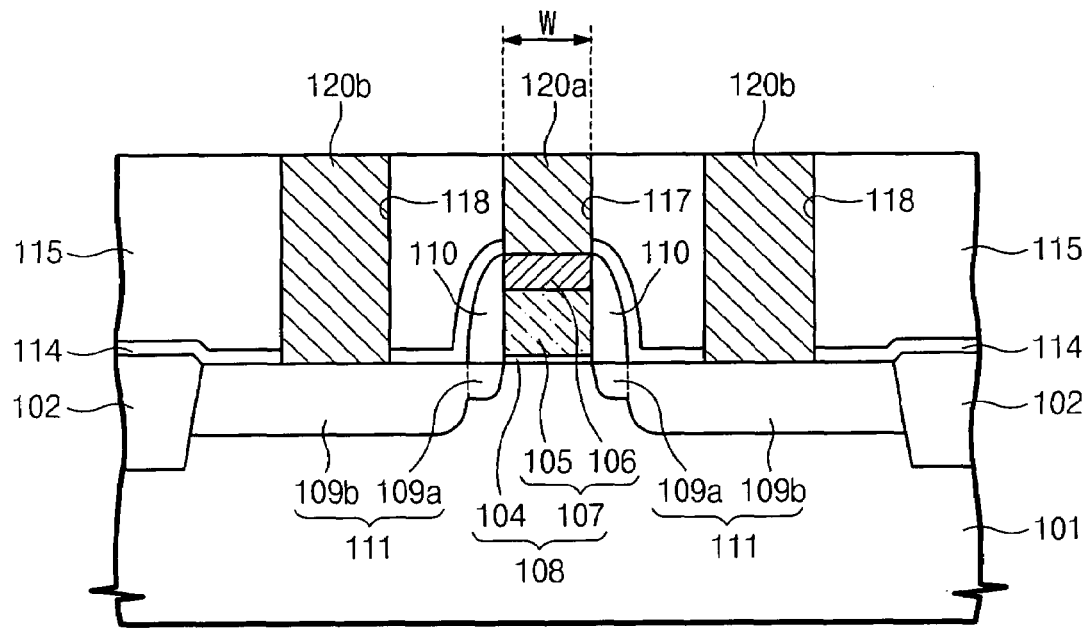
FIG. 5 is a cross-sectional view of the device of FIG. 3 taken along the line III-III' of FIG. 3.

Referring to FIGS. 3, 4 and 5, a device isolation layer 102 is provided on predetermined regions of a semiconductor substrate 10 to define at least one active region 103. The device isolation layer 102 may, for example, be a trench isolation layer. A gate line 108 crosses over the active region 103. The gate line 108 includes a gate insulation pattern 104 and a gate electrode 107 which are stacked on the semiconductor substrate 10 in the order named. The gate insulation pattern 104 may, for example, be made of thermal oxide, and the gate electrode 107 may, for example, be made of doped polysilicon 105. Alternatively, the gate electrode 107 may be made of a polycide that is composed of doped polysilicon 105 and metal silicide 106. The metal silicide 106 may, for example, be tungsten silicide, cobalt silicide, nickel silicide and/or titanium silicide.

A spacer 110 is provided on a sidewall of the gate line 108. The spacer 110 may be made, for example, of silicon oxide, silicon nitride, and/or silicon oxynitride. An impurity diffusion layer 111 is provided in the semiconductor substrate 10 at the active region 103 adjacent to opposite sides of the gate line 108. The impurity diffusion layer 111 corresponds to the source/drain region of the MOS transistor. The impurity diffusion layer 111 may include a lightly doped impurity diffusion layer 109a and a heavily doped impurity diffusion layer 109b.

An etch-stop layer 114 and an interlayer dielectric 115 are sequentially stacked on the device isolation layer 102, the active region 103, the gate line 108, and the spacer 110. The etch-stop layer 114 may be formed of an insulator having an etch selectivity with respect to the interlayer dielectric 115. For example, if the interlayer dielectric 115 is made of silicon oxide, the etch-stop layer 114 may be formed of silicon nitride. The etch-stop layer 114 may also be omitted.

A groove 117 in the interlayer dielectric 115 and the etch stop layer 114 exposes the top surface of the gate line 108. A conductive line pattern 120a is disposed in the groove 117. The conductive line pattern 120a is parallel to the gate line 108 and is electrically connected to the gate electrode 107. The conductive line pattern 120a may be at least the same length as the gate line 108, and may be formed of a metal such as, for example, aluminum (Al), tungsten (W), titanium (Ti), tantalum (Ta) and/or copper (Cu). If the conductive line pattern 120a is made, for example, of W, Al or Cu, a conductive metal nitride layer that acts as a barrier layer may also be conformally stacked in the groove 117 with the tungsten (or aluminum or copper) layer. The conductive metal nitride layer may be omitted. Although in FIG. 3 the conductive line pattern 120a has the same width "W" as the gate line 108, the conductive line pattern may be wider than the gate line 108.

In the semiconductor devices depicted in FIGS. 3, 4 and 5, even if a crack is created at the metal silicide layer 106, the increase in the resistance of the gate electrode 107 that the crack may otherwise cause may be reduced or prevented due to the conductive line pattern 120a, as the conductive line pattern 120a is electrically connected to the top surface of the gate electrode 107 and thereby may act to reduce the resistance of the gate electrode 107. If the gate electrode 107 is made only of a doped polysilicon layer 105, the conductive line pattern 120a will be electrically connected to the doped polysilicon layer 105, which also may act to reduce the resistance of the gate electrode 107. As the resistance of the gate electrode 107 is reduced due to the conductive line pattern 120a, the operation speed of the MOS transistor may be enhanced.

As shown in FIGS. 3 and 5, a plug line 120b may be provided at opposite sides of the conductive line pattern 120a. The plug line 120b is provided in a plug groove 118 which penetrates the interlayer dielectric 115 and the etch stop layer 114 to expose a predetermined region of the impurity diffusion layer 111. The plug line 120b electrically connects adjacent impurity diffusion layers 111 with each other, and may be parallel to the conductive line pattern 120a. The plug line 120b may be provided on both sides or just one side of the gate line 108, or may be omitted altogether The plug line 120b may, for example, be made of the same material as the conductive line pattern 120a.

A method of forming semiconductor devices according to certain embodiments of the present invention will now be described with reference to FIGS. 6 and 7.

Figure 6:
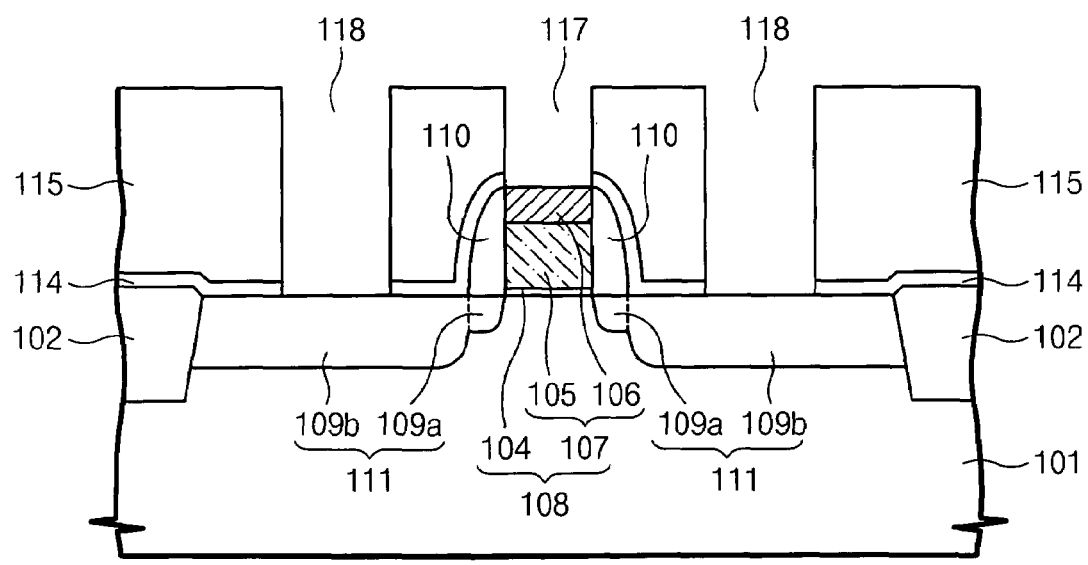
FIGS. 6 and 7 are cross-sectional views of the device of FIG. 3 taken along the line III-III' of FIG. 3 during different stages of fabrication.

As shown in FIG. 6, a device isolation layer 102 is formed in a semiconductor substrate 101 to define at least one active region. The device isolation layer 102 may be a trench isolation layer. A gate line 108 is formed on, and crossing over, the active region. The gate line 108 includes a gate insulation pattern 104 and a gate electrode 107 which are stacked on the active region in the semiconductor substrate 101 in the order named. The gate insulation pattern 104 may, for example, be made of thermal oxide, and the gate electrode 107 may be doped polysilicon 105. Alternatively, the gate electrode 107 may be made of polycide that is composed of doped polysilicon 105 and metal silicide 106 which are stacked in the order named. The metal silicide 106 may, for example, be tungsten silicide, titanium silicide, cobalt silicide and/or nickel silicide. Using the gate line 108 and the device isolation layer 102 as a mask, impurities may be implanted at a low dose to form a lightly doped impurity diffusion layer 109a in the active region adjacent opposite sides of the gate line 108. A spacer layer may then be formed on the surface of the semiconductor substrate 101 including the lightly doped impurity diffusion layer 109a. Next, as shown in FIG. 6, the spacer layer may be anisotropically etched to form a spacer 110 on the sidewalls of the gate line 108. Using the gate line 108, the spacer 110, and the device isolation layer 102 as a mask, impurities may be implanted to form a highly doped impurity diffusion layer 109b adjacent each of the lightly doped impurity diffusion layers 109a. The lightly and heavily doped impurity diffusion layers 109a and 109b constitute a lightly doped drain or "LDD" type impurity diffusion layer 111. The spacer 110 may, for example, be made of silicon oxide, silicon nitride and/or silicon oxynitride.

An etch-stop layer 114 and an interlayer dielectric 115 may then be sequentially formed on the surface of the semiconductor substrate 101 including the impurity diffusion layer 111. The etch-stop layer 114 may be an insulating layer having an etch selectivity with respect to the interlayer dielectric 115. For example, if the interlayer dielectric 115 is made of silicon oxide, the etch-stop layer 114 may be made of silicon nitride. The etch-stop layer 114 may also be omitted.

The interlayer dielectric 115 and the etch-stop layer 114 are successively patterned to form a groove 117 that exposes the top surface of the gate line 108 and to form a plug groove 118 that exposes predetermined regions of at least two impurity diffusion layers 111. The groove 117 typically will be parallel with the gate line 108, and has at least the same length as the gate line 108, although this need not be the case. As illustrated in FIG. 6, the groove 117 may have the same width as the gate line 108 such that the groove 117 exposes the top surface of the gate line 108 and a portion of the spacer 110 so as to secure a processing margin. During the formation of the groove 117 and the plug groove 118, the etch-stop layer 114 may act to prevent the top surface of the gate line 108 and a surface of the impurity diffusion layer 111 from being degraded by the etch process.

Figure 7:
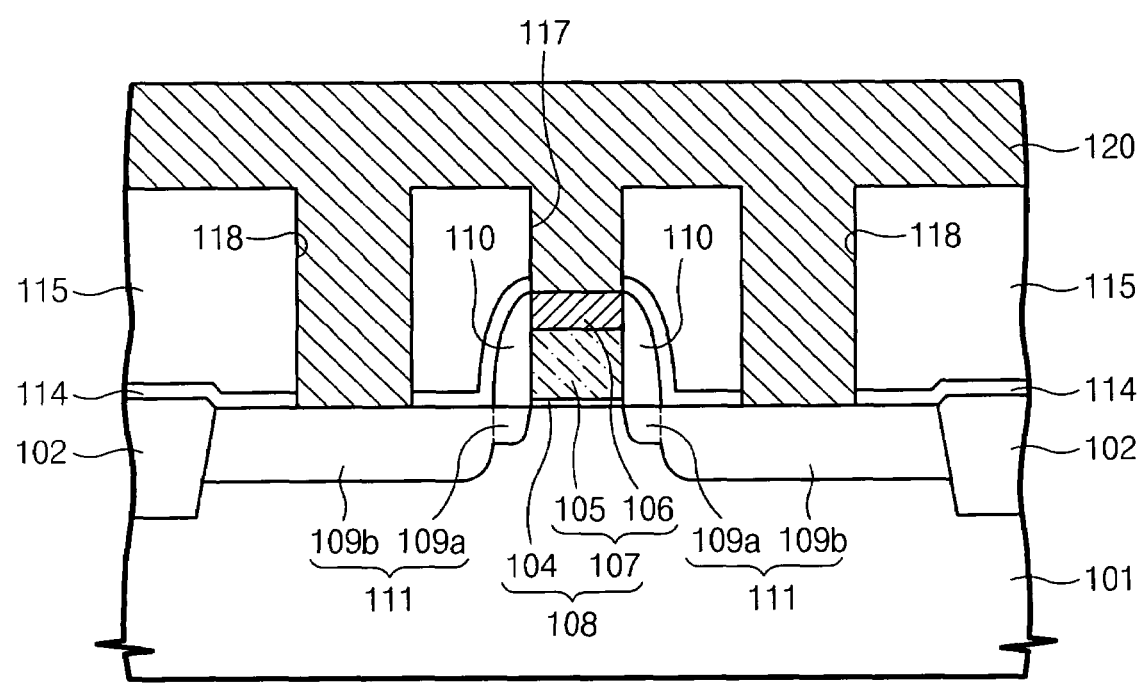

As shown in FIG. 7, a conductive layer 120 is formed on the semiconductor substrate 101. The conductive layer 120 fills the groove 117 and the plug groove 118. The conductive layer may be made of metal such as, for example, tungsten, aluminum, titanium, tantalum and/or copper. The conductive layer 120 also may include a barrier layer that is made of metal nitride, with the metal layer on the metal nitride layer.

The conductive layer 120 may then be planarized down to the top surface of the interlayer dielectric 115 to form a conductive line pattern 120a in the groove 117 and to form a plug line 120b in the plug groove 118, as shown in FIG. 5.

A semiconductor device according to further embodiments of the present invention will now be described with reference to FIG. 8. As the device is similar in certain respects to the semiconductor device described above with reference to FIGS. 3-7, the same numerals will be used below to denote like elements.

Figure 8:
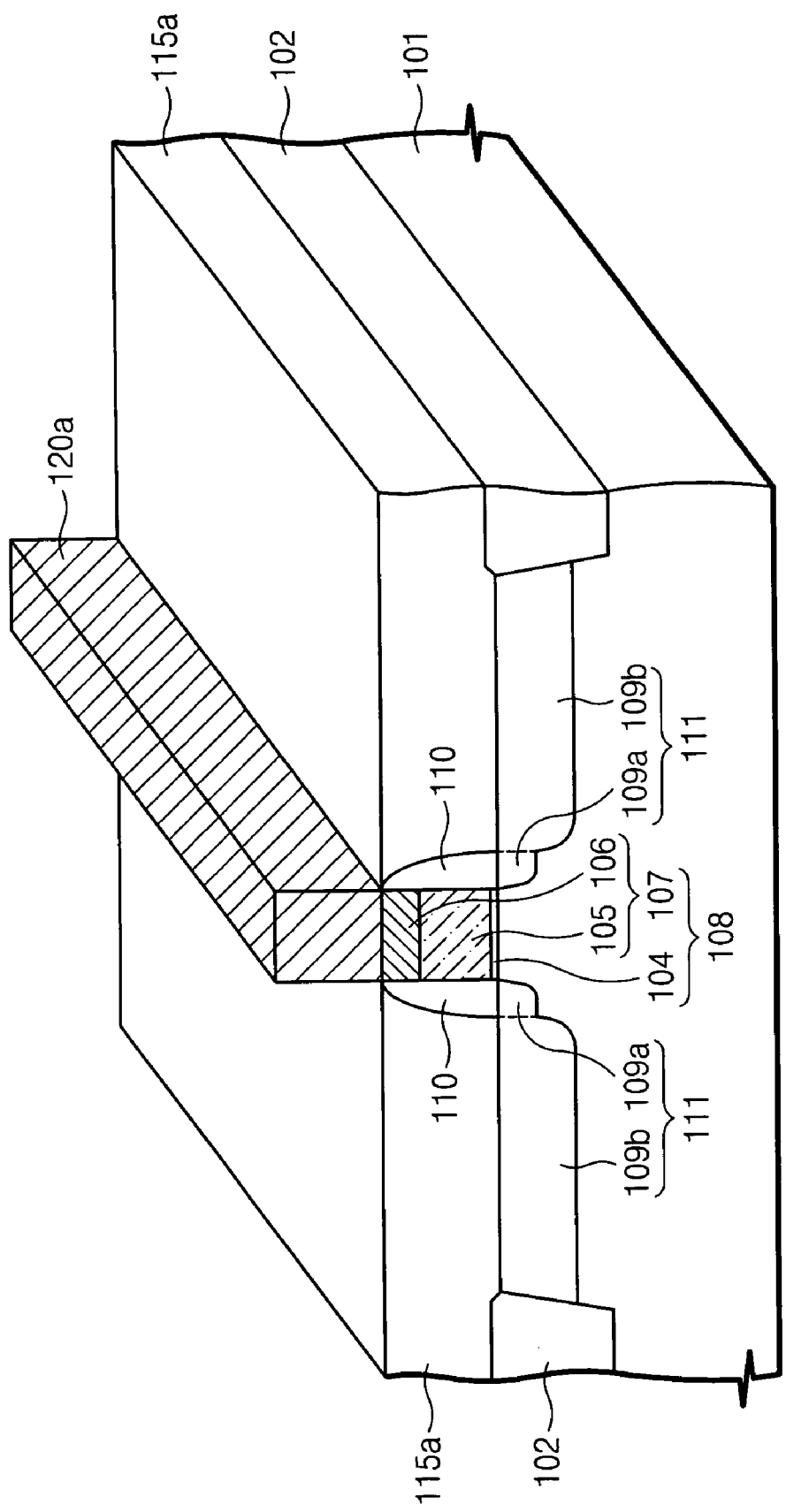
FIG. 8 is a perspective view of a semiconductor device according to further embodiments of the present invention.

As shown in FIG. 8, a device isolation layer 102 is provided on predetermined regions of a semiconductor substrate 101 to define at least one active region in the semiconductor substrate 101. A gate line 108 crosses over the active region. The gate line 108 includes a gate insulation pattern 104 and a gate electrode 107 which are stacked on the semiconductor substrate 101 in the order named. The gate electrode 107 may be made of doped polysilicon 105 and/or polycide. The polycide may be composed of polysilicon 105 and metal silicide 106 which are stacked in the order named.

A spacer 110 is provided on a sidewall of the gate line 108. An impurity diffusion layer 111 is provided in the semiconductor substrate adjacent to opposite sides of the gate line 108. A planarized interlayer dielectric 115a is provided on the semiconductor substrate 101, the gate line 108, the spacer 110 and the device isolation layer 102. The planarized interlayer dielectric 115a may be a layer that is planarized until the top surface of the gate line 108 is exposed. A conductive line pattern 120a is provided on the exposed gate line 108. The conductive line pattern 120a may be parallel to the gate line 108 and is electrically connected to the gate electrode 107. In certain embodiments, the conductive line pattern 120a is made of metal. If a crack forms in the metal silicide layer 106, the tendency for the resistance of the gate electrode 108 to increase may be reduced or eliminated due to the conductive line pattern 120a.

Methods of forming semiconductor devices according to further embodiments of the present invention will now be described with reference to FIGS. 9 and 10.

Figure 9:
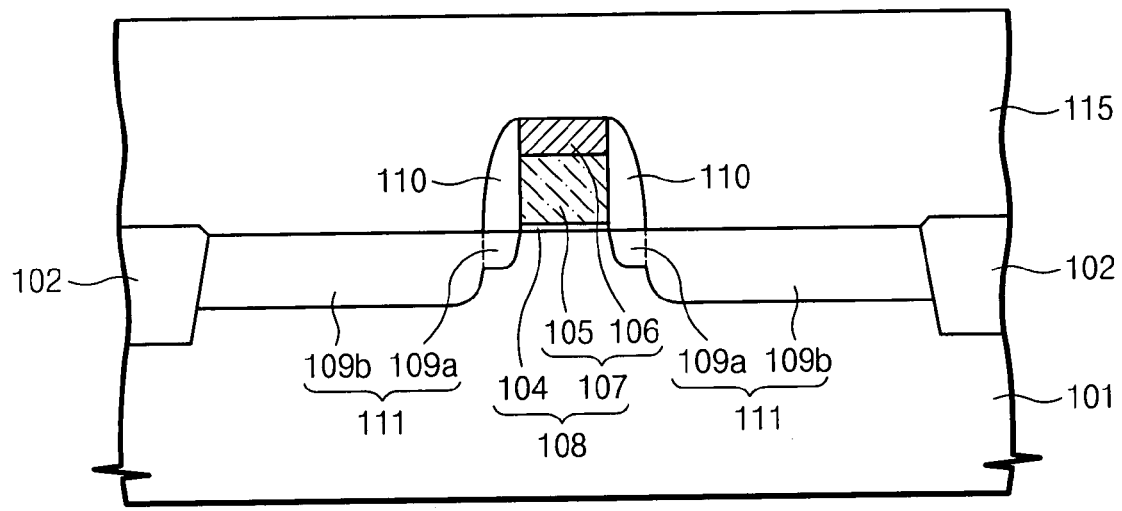
FIGS. 9 and 10 are cross-sectional views of the device of FIG. 8.
Figure 10:
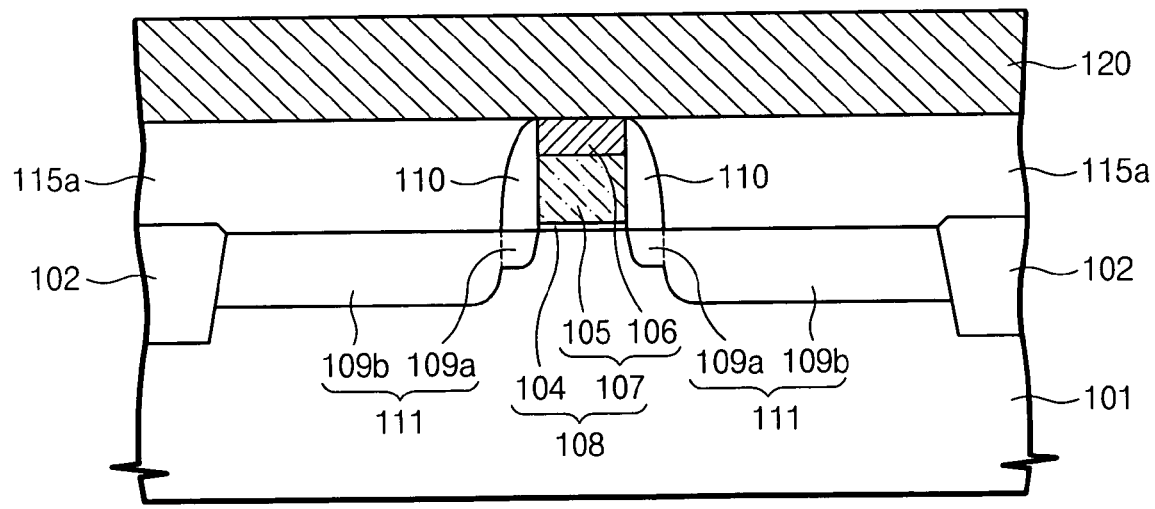

Referring to FIGS. 9 and 10, a gate line 108, a spacer 110, and an impurity diffusion layer 111 may be formed in the manner described above with reference to FIG. 6. An interlayer dielectric 115 may then be formed on the surface of the semiconductor substrate 101 including the gate line 108, the spacer 110, and the impurity diffusion layer 111. The interlayer dielectric 115 may be made, for example, of silicon oxide.

The interlayer dielectric 115 may then be planarized, until the top surface of the gate line 108 is exposed, to form a planarized interlayer dielectric 115a. A conductive layer 120 is then formed on the surface of a semiconductor substrate 101 including the exposed gate line 108. The conductive layer 120 is patterned to form the conductive line pattern 120a shown in FIG. 8.

The various layers of the semiconductor device depicted in FIGS. 8-10 may be formed using the materials described above for corresponding elements in the description of the semiconductor device depicted in FIGS. 3-7.

Semiconductor devices according to additional embodiments of the present invention will now be described with reference to FIGS. 11, 12 and 13. FIG. 12 is a cross-sectional view taken along line IV-IV' of FIG. 11 and FIG. 13 is a cross-sectional view taken long line V-V' of FIG. 11.

Figure 11:
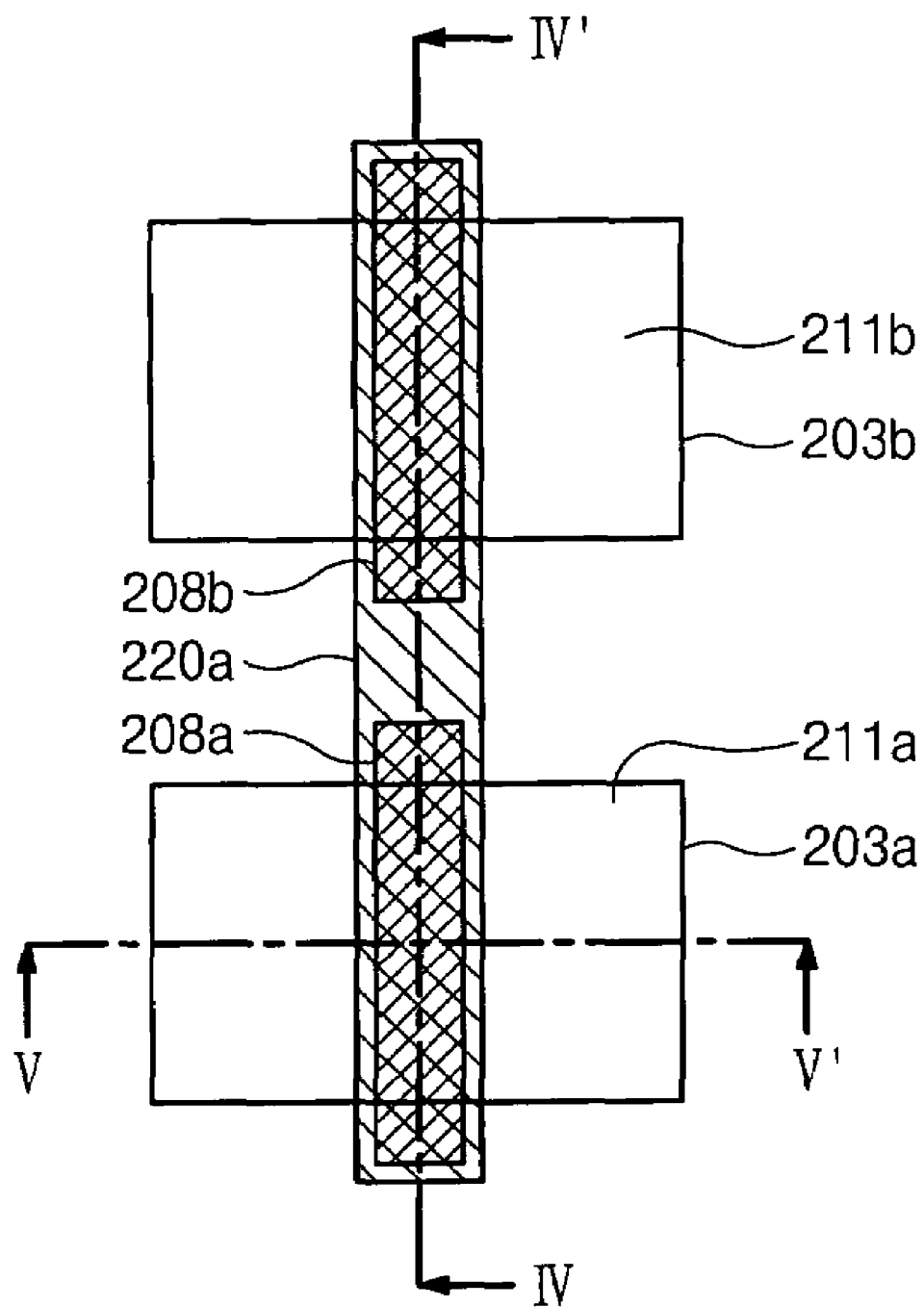
FIG. 11 is a top plan view of a semiconductor device according to further embodiments of the present invention.
Figure 12:
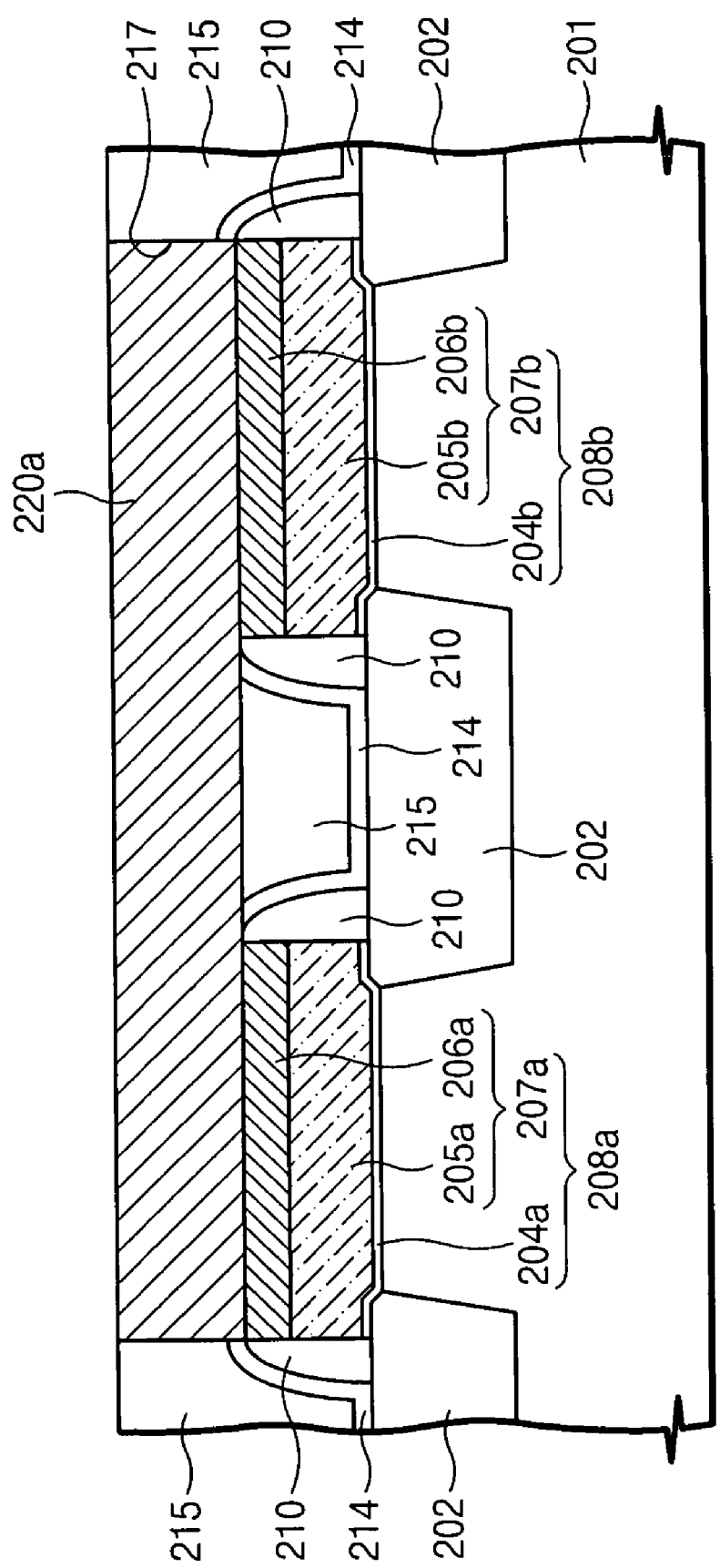
FIG. 12 is a cross-sectional view of the device of FIG. 11 taken along the line IV-IV' of FIG. 11.
Figure 13:
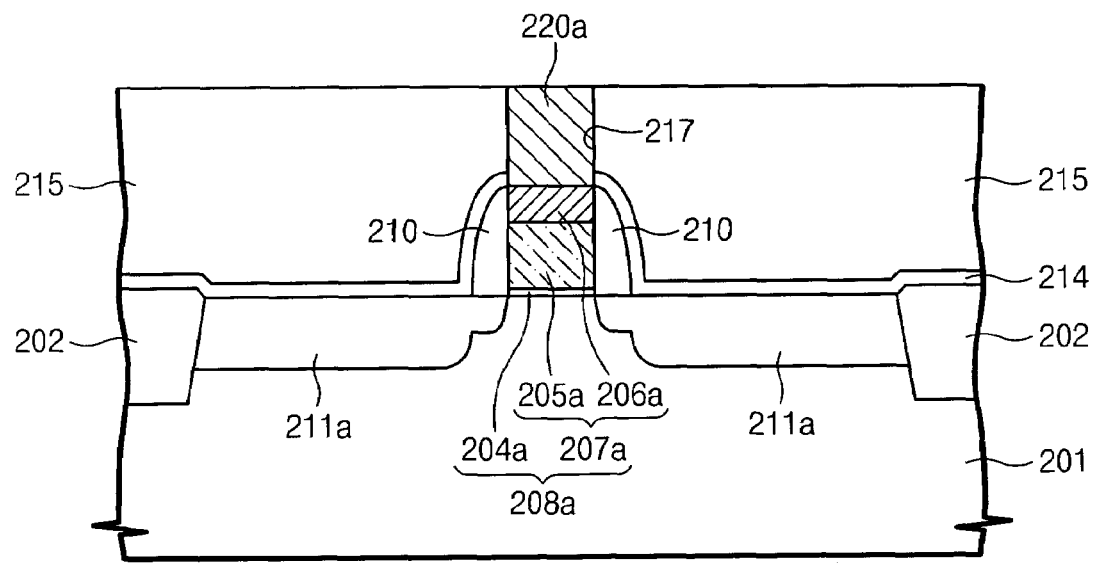
FIG. 13 is a cross-sectional view of the device of FIG. 11 taken along the line V-V' of FIG. 11.

Referring to FIGS. 11, 12 and 13, a device isolation layer 202 is formed on predetermined regions of a semiconductor substrate 201 to define at least one first active region 203a and at least one second active region 203b.

A first gate line 208a is formed on, and crossing over, the first active region 203a, and a second gate line 208b is formed on, and crossing over, the second active region 203b. The first and second gate lines 208a and 208b are spaced apart from each other and may be co-linearly disposed. The first gate line 208a includes a first gate insulation pattern 204a and a first gate electrode 207a which are stacked in the order named. The second gate line 208b includes a second insulation pattern 204b and a second gate electrode 207b which are stacked in the order named. The first and second gate insulation patterns 204a and 204b may be made, for example, of thermal oxide. The first electrode 207a may include a first doped polysilicon 205a and/or a first polycide that is composed of the first doped polysilicon layer 205a and a first metal silicide layer 206a which are stacked in the order named. The second gate electrode 207b may include a second doped polysilicon layer 205b and/or a second polycide that is composed of the second doped polysilicon layer 205b and a second metal silicide 206b. The first and second doped polysilicon layers 205a and 205b may be doped with the same or different conductive impurities. The first and second metal silicides 206a and 206b may be formed, for example, of tungsten silicide, cobalt silicide, nickel silicide and/or titanium silicide.

A first impurity diffusion layer 211a is formed in the semiconductor substrate 201 adjacent opposite sides of the first gate line 208a. A second impurity diffusion layer 211b is formed in the semiconductor substrate 201 adjacent to opposite sides of the second gate line 208b. The first and second impurity diffusion layers 211a and 211b may be doped with the same or different conductive impurities. A spacer 210 is provided on sidewalls of the first and second gate lines 208a and 208b. The spacer 210 may be formed, for example, of silicon oxide, silicon nitride and/or silicon oxynitride.

An etch-stop layer 214 and an interlayer dielectric 215 may then be sequentially stacked on the surface of the semiconductor substrate 201, including the first and second gate lines 208a and 208b. The etch-stop layer 214 may be formed of an insulation material having an etch selectivity with respect to the interlayer dielectric 215. For example, if the interlayer dielectric 215 is formed of silicon oxide, the etch-stop layer 214 may be formed of silicon nitride. The etch-stop layer 214 may be omitted.

As shown best in FIG. 13, a groove 217 may be formed in the interlayer dielectric 215 and the etch-stop layer 214 to expose the top surfaces of the first and second gate lines 208a and 208b. A conductive line pattern 220a is formed in the groove 217. The conductive line pattern 220a includes a portion that is parallel with the first gate line 208a, a portion that is parallel with the second gate line 208b, and a connecting portion. The portion of the conductive line pattern 220a that is parallel with the first gate line 208a may be at least the same length as the first gate line 208a, and the portion that is parallel with the second gate line 208b may be at least the same length as the second gate line 208b. The conductive line pattern 220a electrically connects the first and second gate electrodes 207a and 207b with each other. The conductive line pattern 220a may be formed of metal such as, for example, aluminum, tungsten, titanium, tantalum and/or copper. The conductive line pattern 220a may further include a metal nitride barrier layer that is interposed between the first and second gate electrodes 207a and 207b and the metal layer of conductive line pattern 220a.

The first gate line 208a and the first impurity diffusion layers 211a constitute a first MOS transistor, and the second gate line 208b and the second impurity diffusion layers 211b constitute a second MOS transistor. The first MOS transistor may be an NMOS transistor or a PMOS transistor. Similarly, the second MOS transistor may be an NMOS transistor or a PMOS transistor.

In the above-described semiconductor device, the conductive line pattern 220a may reduce the resistance of the first and second gate electrodes 207a and 207b and electrically connect the first and second gate electrodes 207a and 207b with each other. As such, if a crack forms in one or both of the first and second metal silicide layers 206a and 206b, the impact of the crack(s) on the resistance of the first and/or second gate electrodes 207a and 207b may be reduced. Moreover, even if the first and second metal silicide layers 206a and 206b are omitted, the conductive line pattern 220a may reduce the resistance of the first and second gate electrodes 207a and 207b. The conductive line pattern 220a also acts as an interconnection for electrically connecting the first and second gate electrodes 207a and 207b with each other. Such an arrangement may reduce the interconnection resistance as compared to a typical interconnection structure using contact plugs with an interconnection disposed thereon. Thus, semiconductor devices according to certain embodiments of the present invention may reduce, minimize or prevent the resistance of the gate electrode from increasing when a crack forms in the metal silicide layer. Further, the first and second gate electrodes 207a and 207b are directly connected to each other which may facilitate providing a high-speed semiconductor device.

Figure 14:
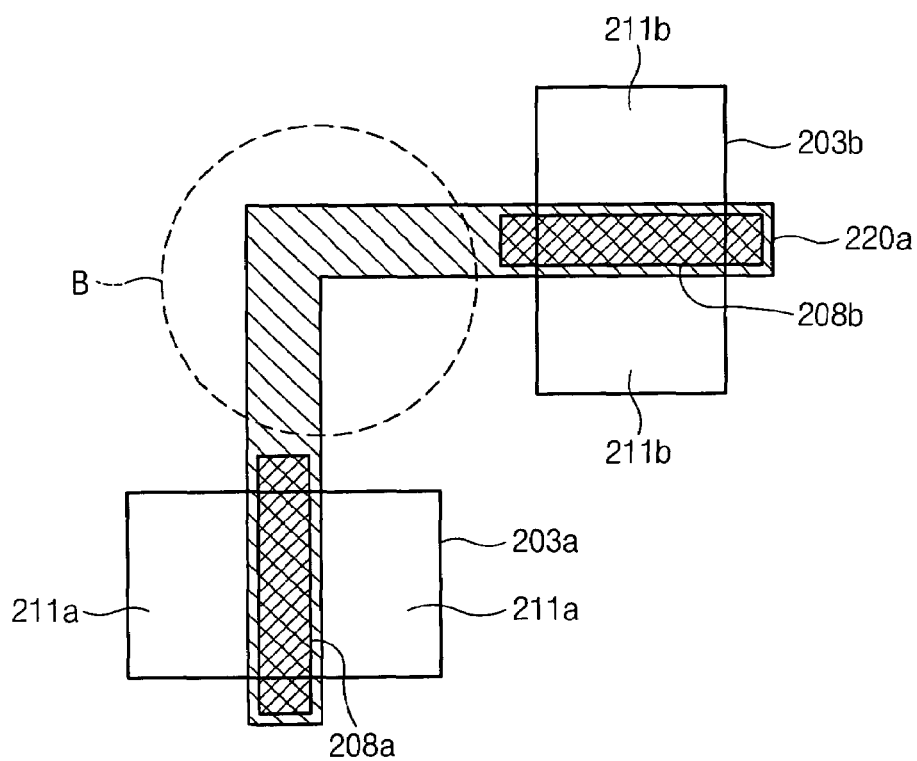
FIG. 14 is a top plan view of an alternative conductive line pattern for semiconductor devices according to further embodiments of the present invention.

FIG. 14 illustrates a semiconductor device according to additional embodiments of the present invention in which the first and second gate lines 208a and 208b are disposed on different lines.

As shown in FIG. 14, the first and second gate lines 208a and 208b are formed to cross respective first and second active regions 203a and 203b, which are spaced apart from each other. The first and second gate lines 208a and 208b are spaced apart from each other and are perpendicular to each other viewed from a top plan view. A conductive line pattern 220a is formed on the first and second gate lines 208a and 208b. A connecting portion "B" of the conductive line pattern 220a may vertically bend according to the position of the first and second gate lines 208a and 208b.

Figure 15A:
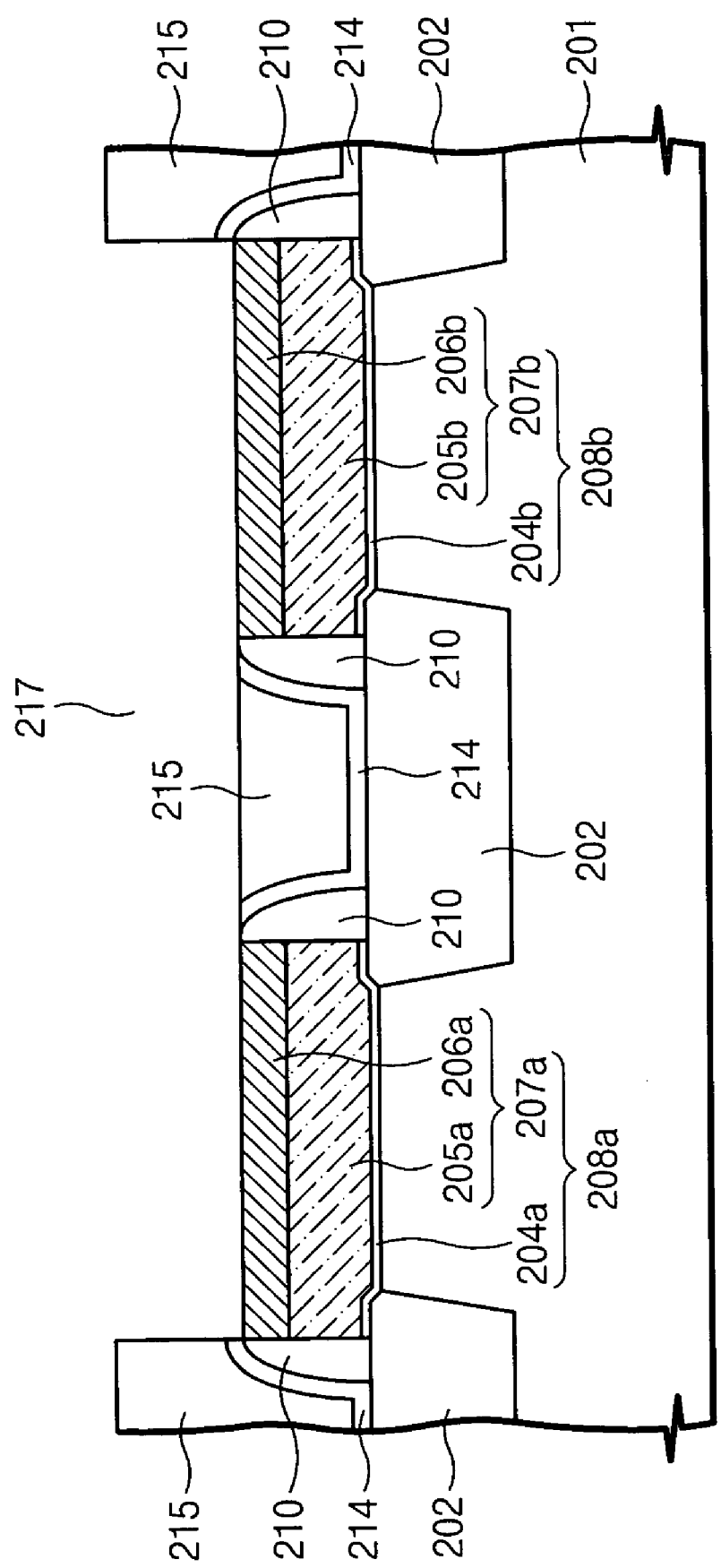
FIGS. 15A and 16A are cross-sectional views of the device of FIG. 11 taken along the line IV-IV' of FIG. 11 during different stages of fabrication.
Figure 15B:
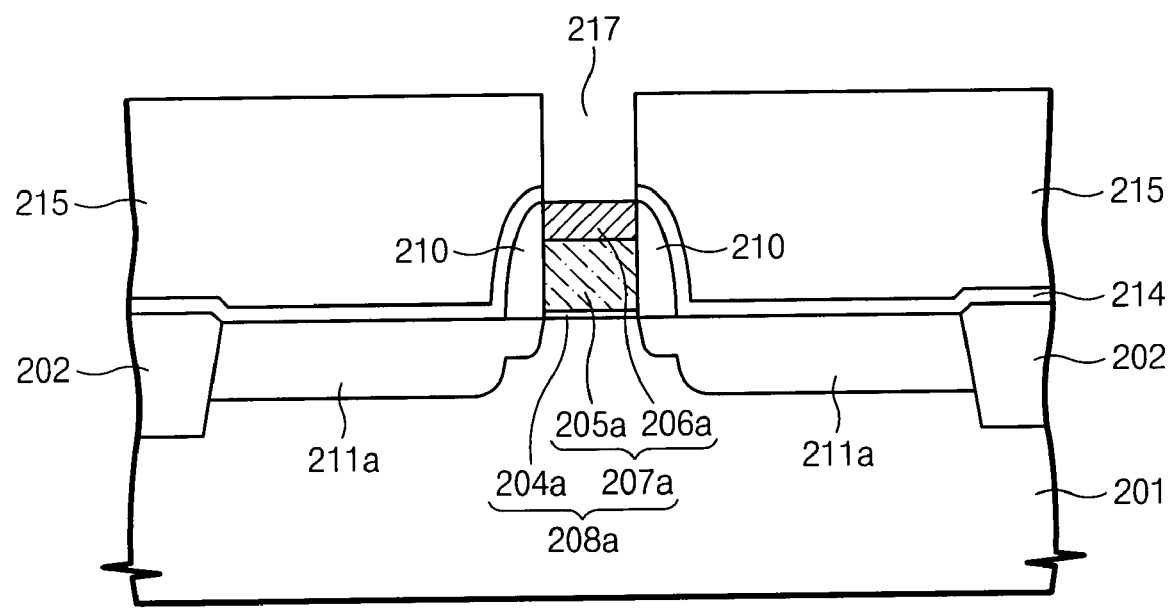
FIGS. 15B and 16B are cross-sectional views of the device of FIG. 11 taken along the line V-V' of FIG. 11 during different stages of fabrication.
Figure 16A:
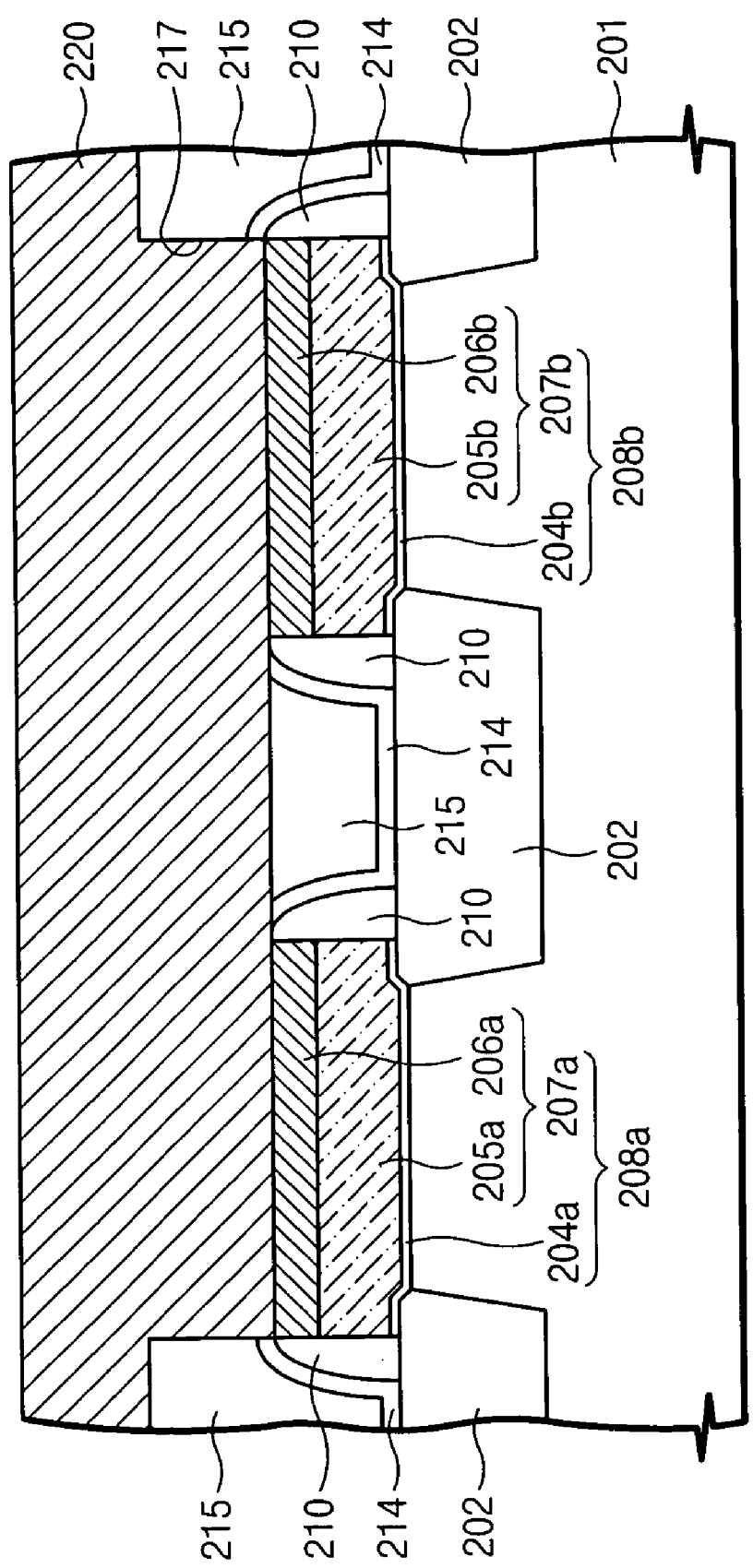
Figure 16B:
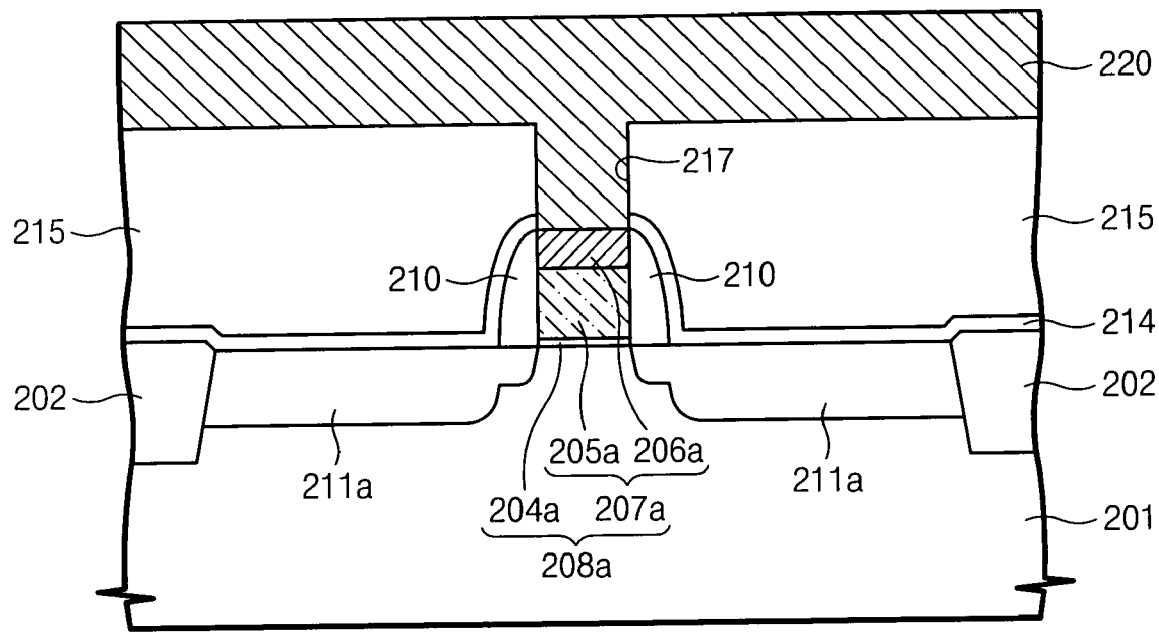

Cross-sectional views taken along a line IV-IV' of FIG. 11 are illustrated in FIGS. 15A and 16A, and cross-sectional views taken along a line V-V' of FIG. 11 are illustrated in FIGS. 15B and 16B.

Referring to FIGS. 15A and 16A, a device isolation layer 202 is formed in predetermineds region of a semiconductor substrate 201 to define at least one first active region and at least one second active region. A first gate line 208a is formed on, and crossing over, the first active region, and a second gate line 208b is formed on, and crossing over, the second active region. The first and second gate lines 208a and 208b are spaced apart from each other. The first gate line 208a includes a first gate insulation pattern 204a and a first gate electrode 207a which are stacked on the semiconductor substrate 201 in the order named. The second gate line 208b includes a second gate insulation pattern 204b and a second gate electrode 207b which are stacked on the semiconductor substrate 201 in the order named.

The first and second gate insulation patterns 204a and 204b may be formed, for example, of thermal oxide. The first gate electrode 207a may include a first doped polysilicon layer 205a or a first polycide. The first polycide may include a first doped polysilicon layer 205a and a metal silicide 206a which are stacked in the order named. The second gate electrode 207b may include a second doped polysilicon layer 205b and/or a second polycide. The second polycide may include a second doped polysilicon layer 205b and/or a second metal silicide 206b. The first and second doped polysilicon layers 205a and 205b may be doped with the same or different conductive impurities. The first and second metal silicide layers 206a and 206b may be formed of, for example, tungsten silicide, cobalt silicide, nickel silicide and/or titanium silicide.

Impurities are implanted into the semiconductor substrate 201 adjacent to opposite sides of the first gate line 208a and into the semiconductor substrate 201 adjacent to opposite sides of the second gate line 208b to form a first impurity diffusion layer 211a and a second impurity diffusion layer 211b, respectively. The first and second impurity diffusion layers 211a and 211b may be formed to have an LDD structure. The first and second impurity diffusion layers 211a and 211b may include the same or different conductive impurities, and may be formed simultaneously or sequentially. A spacer 210 may be formed on sidewalls of the first and second gate lines 208a and 208b. The spacer 210 may be formed, for example, of silicon oxide, silicon nitride and/or silicon oxynitride.

An etch-stop layer 214 and an interlayer dielectric 215 are sequentially formed on the surface of a semiconductor substrate 201 including the spacer 210. The etch-stop layer 214 may be formed of an insulating material having an etch selectivity with respect to the interlayer dielectric 215. For example, if the interlayer dielectric 215 is made of silicon oxide, the etch-stop layer 214 may be made of silicon nitride. The etch-stop layer 214 may be omitted.

The interlayer dielectric 215 and the etch-stop layer 214 are successively patterned to form a groove 217 that exposes the top surfaces of the first and second gate lines 208a and 208b. The etch-stop layer 214 may protect the top surfaces of the first and second gate lines 208a and 208b from damage when the groove 217 is formed. In addition, the etch-stop layer may help to prevent overetching of the interlayer dielectric 215 between the first and second gate electrodes 207a and 207b.

Referring to FIGS. 16A and 16B, a conductive layer 220 is formed on the surface of the semiconductor substrate 201 to fill the groove 217. The conductive layer 220 may be formed of a metal such as, for example, tungsten, aluminum, titanium, tantalum and/or copper. In some cases, the conductive layer 220 may include a metal nitride barrier layer. The conductive layer 220 may then be planarized down to the top surface of the interlayer dielectric 215 to form the conductive line pattern 220a shown in FIGS. 12 and 13

Figure 17:
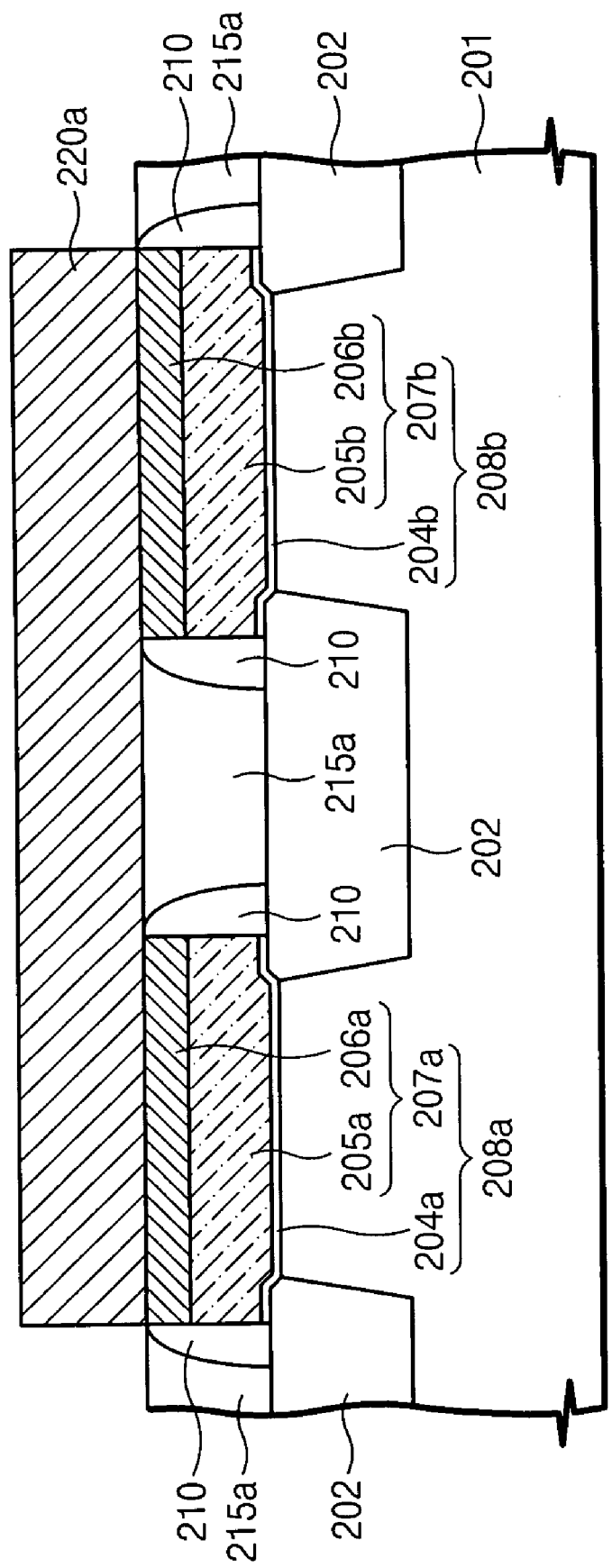
FIG. 17 is a cross-sectional view of a semiconductor device according to further embodiments of the present invention.

A cross-sectional view of a semiconductor device according to the further embodiments of the present invention is illustrated in FIG. 17.

As shown in FIG. 17, the semiconductor device may include a device isolation layer 202, first and second gate lines 208a and 208b, a spacer 210, and first and second impurity diffusion layers 211a and 211b. These portions of the device are described previously herein with respect to FIGS. 11, 12 and 13.

A planarized interlayer dielectric 215a is formed on the semiconductor substrate 201, the device isolation layer 202, the first and second gate lines 208a and 208b, the spacer 210, and the first and second impurity diffusion layers 211a and 211b. The planarized interlayer dielectric 215a is a layer that is planarized until the top surfaces of the first and second gate lines 208a and 208b are exposed. A conductive line pattern 220a is disposed on the exposed first and second gate lines 208a and 208b. The conductive line pattern 220a has a portion that is parallel to the first gate line 208a and a portion that is parallel to the second gate line 208b. The portion parallel to the first gate line 208a of the conductive line pattern 220a may have at least the same length as the first gate line 208a. The portion parallel to the second gate line 208b of the conductive line pattern 220a may have at least the same length as the second gate line 208b.

The conductive line pattern 220a may be formed to cover the entire length of the top surfaces of the first and second gate lines 208a and 208b. The conductive line pattern 220a electrically connects the first and second gate electrodes 207a and 207b with each other. Thus, the conductive line pattern 220a may reduce the resistance of the first and second gate electrodes 207a and 207b and act to interconnect the first and second gate electrodes 207a and 207b. As a result, it is possible to reduce, minimize and/or prevent the resistance of the gate electrode from increasing if a crack is formed in the metal silicide layer. Additionally, the spaced electrodes 207a and 207b are directly connected to each other, which may facilitate providing a high-speed semiconductor device.

A method of forming semiconductor devices according to further embodiments of the present invention will now be described with reference to FIGS. 18 and 19.

Figure 18:
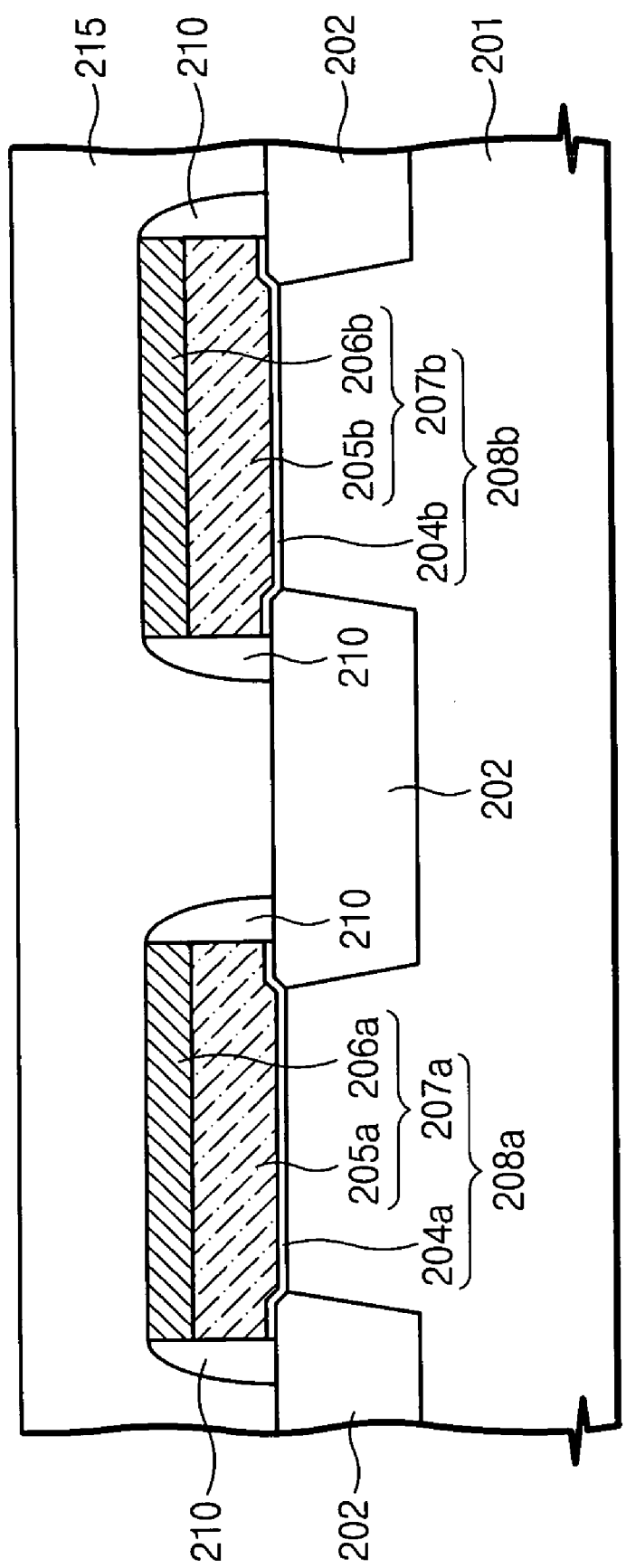
FIGS. 18 and 19 are cross-sectional views of the device of FIG. 17 during different stages of fabrication.
Figure 19:
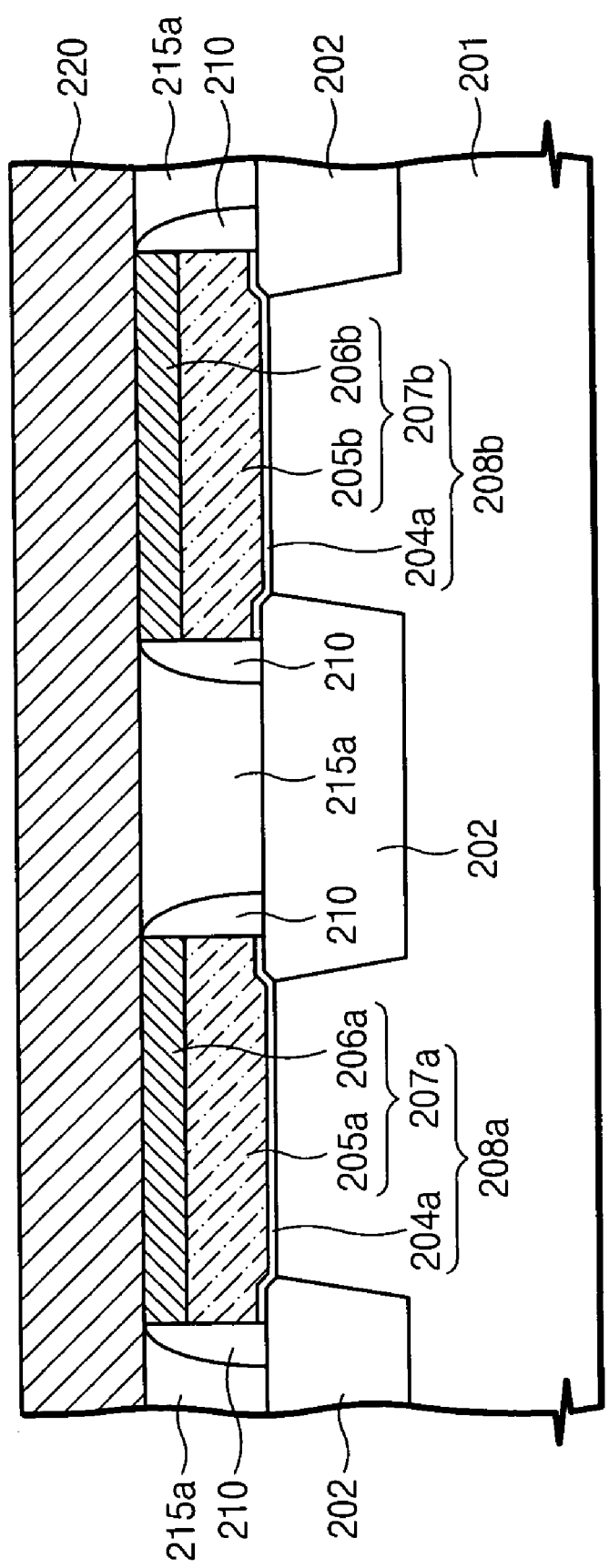

As shown in FIGS. 18 and 19, first and second gate lines 208a and 208b, a spacer 210, and first and second impurity diffusion layers are formed in the same manner as described above in the discussion of FIGS. 15A and 15B. An interlayer dielectric 215 is formed on the surface of the semiconductor substrate 201, including the first and second gate lines 208a and 208b and the spacer 210.

The interlayer dielectric 215 is planarized, until the top surfaces of the first and second gate lines 208a and 208b are exposed to form a planarized interlayer dielectric 215a. A conductive layer 220 is formed on the surface of a semiconductor substrate, including the exposed first and second gate lines 208a and 208b. The conductive layer may be formed of metal. The conductive layer 220 is patterned to form the conductive line pattern 220a that is shown in FIG. 17.

In the third and fourth embodiments, corresponding elements may be made of the same materials.

While this invention has been particularly shown and described with reference to preferred embodiments thereof, it will be understood by those skilled in the art that various changes in form and details may be made therein without departing from the spirit and scope of the invention as defined by the appended claims and equivalents.

What is claimed is:

1. A semiconductor device comprising:
   a semiconductor substrate;
   a gate line including a gate insulation pattern, a gate electrode that comprises a doped polysilicon layer and a metal silicide layer which are sequentially stacked on the semiconductor substrate;
   a spacer formed on a sidewall of the gate line;
   a conductive line pattern disposed on the gate line; and
   an interlayer dielectric on the semiconductor substrate having a top surface that is coplanar with a top surface of the gate line;
   wherein the conductive line pattern is parallel to the gate line and electrically connected to the gate electrode.

2. The semiconductor device of claim 1, wherein the conductive line pattern has at least the same length as the gate line.

3. The semiconductor device of claim 1, wherein the conductive line pattern is made of metal.

4. The semiconductor device of claim 1, wherein the conductive line pattern bridges at least one gap in the metal silicide layer.

5. The semiconductor device of claim 1, wherein the conductive line pattern decreases the resistance of the gate electrode.

6. A semiconductor device comprising:
   a semiconductor substrate;
   a first gate line and a second gate line on the semiconductor substrate and spaced apart from each other, the first gate line including a first gate electrode stacked on a first gate insulation pattern, and the second gate line including a second gate electrode stacked on a second gate insulation pattern;
   a conductive line pattern on the first and second gate lines, wherein the conductive line pattern has a first portion parallel to the first gate line and a second portion parallel to the second gate line, and wherein the conductive line pattern electrically connects the first and second gate electrodes with each other; and
   an interlayer dielectric on the semiconductor substrate that is planarized to the height of the first and second gate lines, wherein the conductive line pattern is also disposed on the interlayer dielectric between the first and second gate lines;
   wherein the first and second gate lines each comprise a metal silicide layer on a doped polysilicon layer.

7. The semiconductor device of claim 6, wherein the first portion of the conductive line pattern is at least the same length as the first gate line, and the second portion of the conductive line pattern is at least the same length as the second gate line.

8. The semiconductor device of claim 6, wherein the conductive line pattern is made of metal.

9. The semiconductor device of claim 6, wherein the conductive line pattern bridges at least one gap in the metal silicide layer.

10. The semiconductor device of claim 6, wherein the conductive line pattern decreases the resistance of the first and second gate electrodes.

11. A semiconductor device, comprising:
    a gate electrode on a semiconductor substrate, the gate electrode including a polysilicon layer and a metal silicide layer which are sequentially stacked; and
    a conductive line pattern on the gate electrode, the conductive line pattern extending in a first direction and being in contact with the gate electrode along the first direction,
    wherein the first direction is substantially parallel to a longitudinal direction of the gate electrode.

12. The semiconductor device of claim 11, further comprising a gate insulation pattern between the semiconductor substrate and the gate electrode.

13. The semiconductor device of claim 11, wherein the conductive line pattern is formed of at least one of aluminum, tungsten, titanium, tantalum, or copper.

14. The semiconductor device of claim 11, further comprising an interlayer dielectric on the semiconductor substrate, and wherein the conductive line pattern is disposed in a groove in the interlayer dielectric, and the conductive line pattern has a top surface that is coplanar with a top surface of the interlayer dielectric.

15. The semiconductor device of claim 14, further comprising a plug line penetrating the interlayer dielectric layer, the plug line being electrically connected to the semiconductor substrate outside of the gate electrode and extending in the first direction.

16. The semiconductor device of claim 11, further comprising a planarized interlayer dielectric on the semiconductor substrate, wherein the top surface of the planarized interlayer dielectric and the top surface of the gate electrode are substantially the same height above the semiconductor substrate.

17. The semiconductor device of claim 11, further comprising a second gate electrode with the same material as the gate electrode, wherein the conductive line pattern is in contact with the second gate electrode.

18. The semiconductor device of claim 17, wherein the second gate electrode extends in the first direction.

19. The semiconductor device of claim 17, wherein the second gate electrode extends in a second direction, and wherein the conductive line pattern further extends along the second direction.

20. The semiconductor device of claim 15, further comprising a second gate electrode on the semiconductor substrate, wherein the second gate electrode comprises a metal silicide layer on a polysilicon layer, and wherein the conductive line pattern electrically connects the gate electrode and the second gate electrode.

21. The semiconductor device of claim 16, further comprising a second gate electrode on the semiconductor substrate, wherein the second gate electrode comprises a metal silicide layer on a polysilicon layer, and wherein the conductive line pattern electrically connects the gate electrode and the second gate electrode.

22. The semiconductor device of claim 17, further comprising an interlayer dielectric on the semiconductor substrate, and wherein the conductive line pattern is disposed in a groove in the interlayer dielectric.

23. The semiconductor device of claim 22, wherein the interlayer dielectric includes a second groove, and wherein the device further comprises a plug line that electrically connects a source/drain region in the semiconductor device with a source/drain region of an adjacent semiconductor device.

24. The semiconductor device of claim 11, wherein the conductive line pattern is formed of a different material than the metal silicide layer.

25. The semiconductor device of claim 1, wherein the conductive line pattern is formed of a different material than the metal silicide layer.

26. A semiconductor device comprising:
a semiconductor substrate;
a first gate line and a second gate line on the semiconductor substrate and spaced apart from each other, the first gate line including a first gate electrode stacked on a first gate insulation pattern, and the second gate line including a second gate electrode stacked on a second gate insulation pattern;
a conductive line pattern on the first and second gate lines, wherein the conductive line pattern has a first portion parallel to the first gate line and a second portion parallel to the second gate line, and wherein the conductive line pattern electrically connects the first and second gate electrodes with each other;
wherein the first and second gate lines each comprise a metal silicide layer on a doped polysilicon layer;
wherein the conductive line pattern is a metal line pattern that is on the metal silicide layer.

27. The semiconductor device of claim 26, wherein the conductive line pattern bridges at least one gap in the metal silicide layer.

28. The semiconductor device of claim 6, further comprising a spacer disposed on a sidewall of the first and second gate lines; and
an interlayer dielectric covering the semiconductor substrate that includes a groove that exposes top surfaces of the first and second gate line;
wherein the conductive line pattern is disposed in the groove in the interlayer dielectric.

* * * * *